Figure 1:
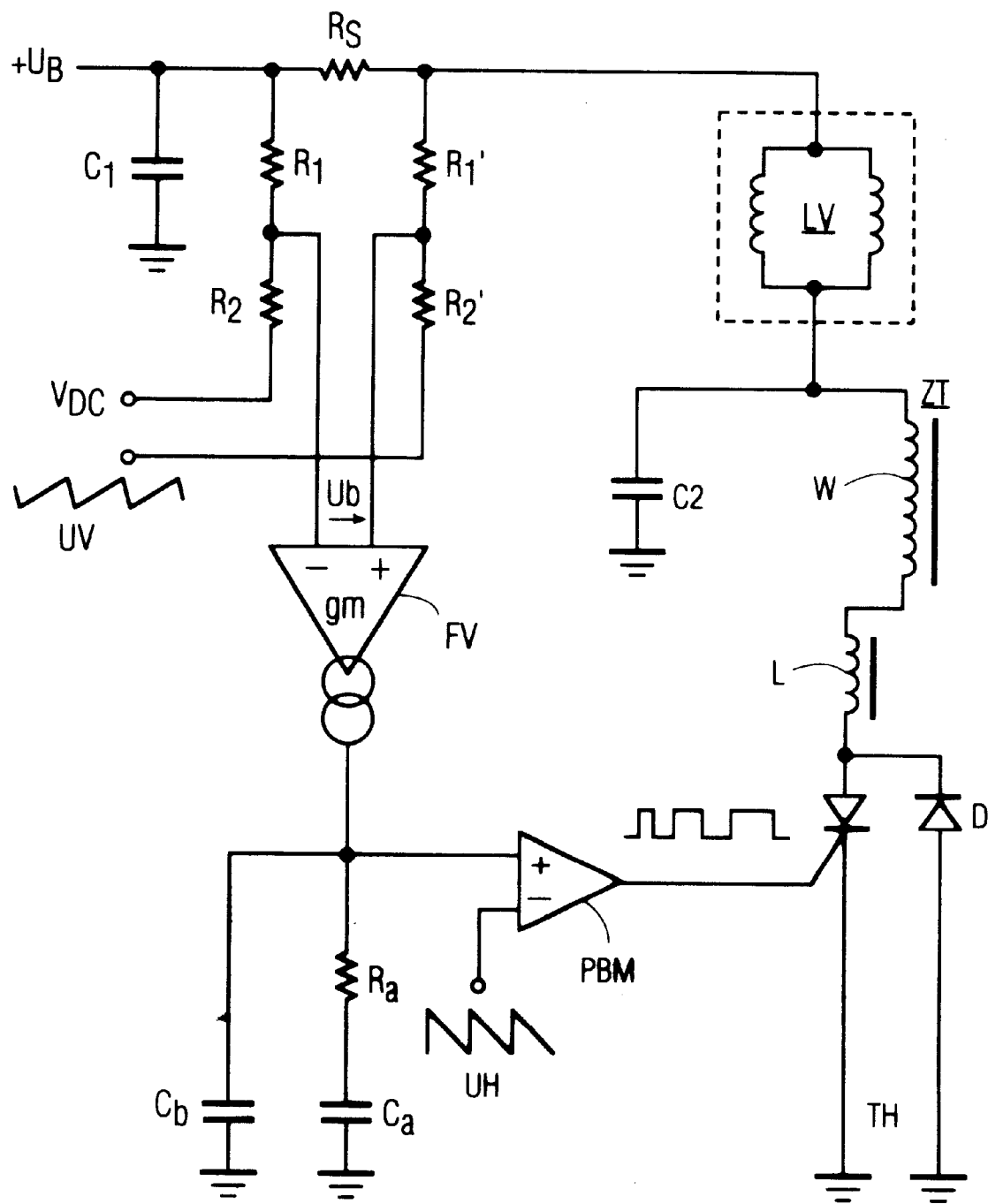

United States Patent [19]
Koblitz

[11] Patent Number: 5,982,115
[45] Date of Patent: Nov. 9, 1999

[54] CIRCUIT ARRANGEMENT FOR PRODUCING A VERTICAL FREQUENCY DEFLECTION CURRENT

[75] Inventor: Rudolf Koblitz, Meylan, France

[73] Assignee: Deutsche Thomson Brandt GmbH, Villingen-Schwenningen, Germany

[21] Appl. No.: 08/999,813

[22] Filed: Feb. 24, 1994

Related U.S. Application Data

[62] Division of application No. 07/974,012, Nov. 9, 1992, Pat. No. 5,313,146, which is a continuation of application No. PCT/EP91/00531.

[30] Foreign Application Priority Data

Mar. 28, 1990 [DE] Germany .............................. 40 09 920

[51] Int. Cl.⁶ .............................. H04N 3/16; G09G 1/04
[52] U.S. Cl. ............................................................ 315/403
[58] Field of Search .................... 315/371, 387, 315/399, 403

[56] References Cited

U.S. PATENT DOCUMENTS

| | | | |
|---|---|---|---|
| 3,646,393 | 2/1972 | Tarr .......................................... | 315/403 |
| 4,262,235 | 4/1981 | Neves et al. .............................. | 315/397 |
| 4,277,729 | 7/1981 | Rodgers, III .............................. | 315/398 |
| 4,297,621 | 10/1981 | Spilsbury .................................. | 315/397 |
| 4,544,864 | 10/1985 | Haferl ...................................... | 315/393 |
| 4,686,432 | 8/1987 | Berland et al. .......................... | 315/403 |
| 4,737,691 | 4/1988 | den Hollander et al. ............... | 315/408 |
| 4,918,359 | 4/1990 | Ogino et al. ............................. | 315/397 |
| 4,956,585 | 9/1990 | Rilly ........................................ | 315/371 |
| 5,229,692 | 7/1993 | Wilber ..................................... | 315/371 |

FOREIGN PATENT DOCUMENTS 55-118274  9/1980  Japan .

*Primary Examiner*—Edward P. Westin
*Assistant Examiner*—Shane R. Gardner
*Attorney, Agent, or Firm*—Joseph S. Tripoli; Joseph J. Laks; Sammy S. Henig

[57] ABSTRACT

A non-switched, DC coupled vertical deflection circuit includes a source of a first DC supply voltage that is coupled to a first end terminal of a vertical deflection winding. An amplifier is energized by a second DC supply voltage having twice the magnitude of the first DC supply voltage and the same polarity. An output voltage of the amplifier having the same polarity of each of the first and second DC supply voltages is developed at a second end terminal of the deflection winding. The amplifier produces a deflection current at opposite polarities, during corresponding portions of a vertical trace interval.

4 Claims, 2 Drawing Sheets

CIRCUIT ARRANGEMENT FOR PRODUCING A VERTICAL FREQUENCY DEFLECTION CURRENT

This is a division of U.S. patent application Ser. No. 07/974,012, filed Nov. 9, 1992, now U.S. Pat. No. 5,313,146 in the name of Rudolf Koblitz, entitled, CIRCUIT ARRANGEMENT FOR PRODUCING A VERTICAL FREQUENCY DEFLECTION CURRENT that is a continuation of PCT application PCT/EP 91/00531 filed Mar. 19, 1991 by Rudolf Koblitz and titled "Circuit Arrangement For Producing A Vertical Frequency Deflection Current".

In modern television receivers, the deflection current is generated by means of a class D amplifier. An electronic switch is triggered by pulse width modulated pulses running at line frequency to periodically switch the deflection coils to frame potential using a line transformer. The deflection current is regulated by an error amplifier, the output terminal of which is connected to one of the input terminals of a pulse width modulator. The other input terminal of the pulse width modulator receives a horizontal frequency sawtooth signal. The error amplifier is connected across one diagonal of a resistance bridge, whereby the two input terminals of the error amplifier are connected to a fixed operating voltage by equal size resistors. Also, a direct voltage reference potential and a vertical frequency sawtooth signal, are applied to the input terminals of the error amplifier by two additional resistors which are the same size as the other two resistors. A sensing resistor, having very low resistance, is connected between the two resistors which are connected to the fixed operating voltage. Such an arrangement is disadvantageous in that the bridging resistors, the error amplifier and the DC behavior of the horizontal frequency sawtooth signal are subject to temperature and other enviromental changes. Also, the various circuit components have inherent tolerances which frequently negatively impact the stability of the circuit.

It is an object of the invention to eliminate the undesirable effects of such drifting and tolerances so that the stability of the circuit arrangement is reduced to the thermal stability of the resistance bridge and of the input offset behavior of the error amplifier, so that the circuit can be realized by way of integrated circuit technology.

Figure 2:
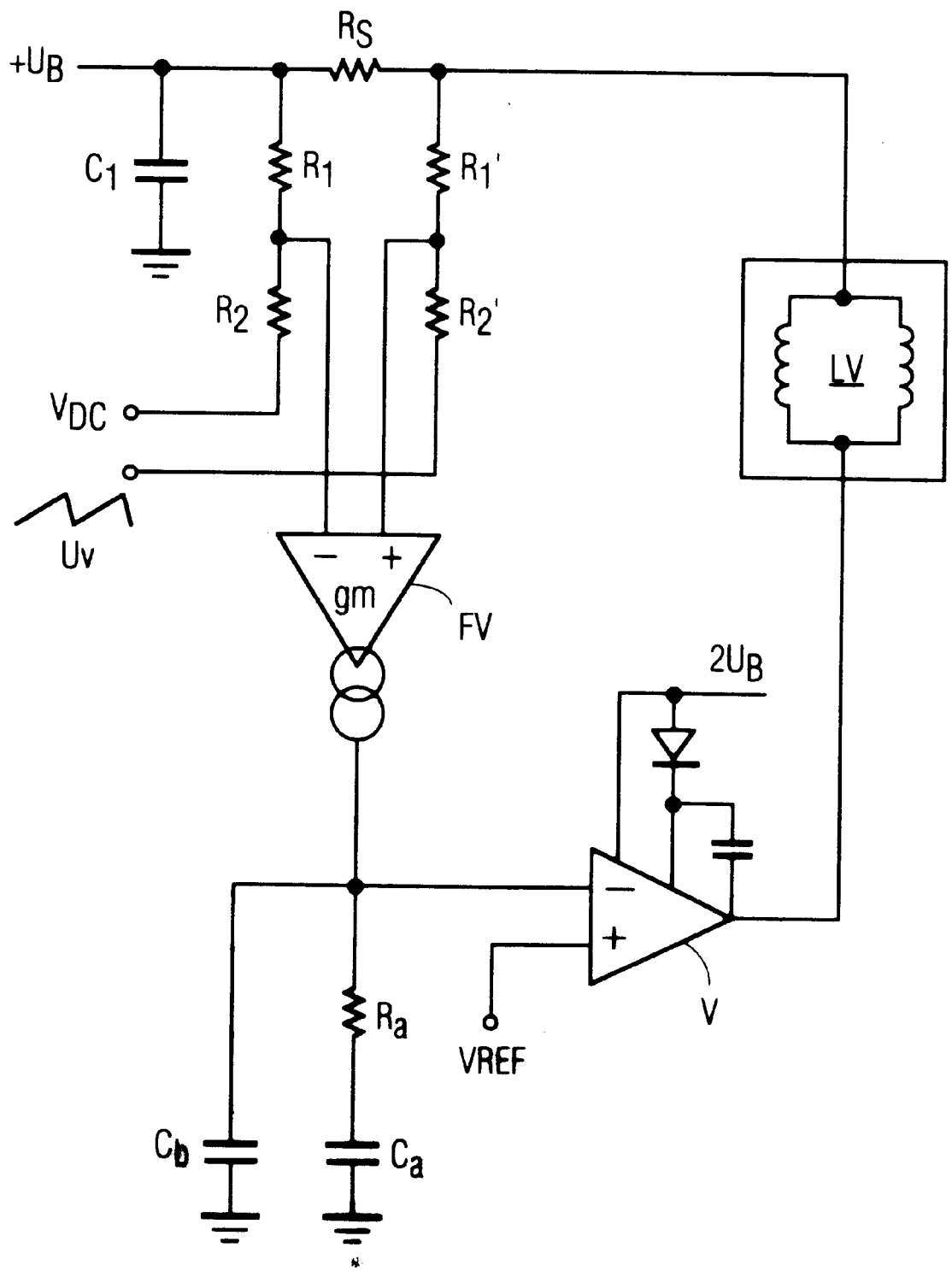

Preferred embodiments are described with reference to the drawings, in which:

FIG. 1 is a first preferred embodiment of the invention.
FIG. 2 is a second preferred embodiment of the invention.

In FIG. 1, a vertical deflection circuit includes vertical deflection coils LV which are connected to an operating direct voltage UB by a current sensor resistor RS which measures the deflection current. The deflection coils LV are switched to reference potential by a controllable electronic switch TH. A winding W of a line transformer ZT and an inductive impedance L connects the switch to the deflection coils LV. The junction of the vertical deflection coils LV and the winding W of the line transformer ZT is connected to frame potential by an integrated capacitor C2. A diode D is connected in parallel to an electronic switch TH to permit a reflux, or free-running operation of the circuit. The electronic switch TH is triggered by line frequency pulses which are pulse width modulated so that the intervals during which the vertical deflection coils LV are at frame potential, are adapted to the deflection angle. The line frequency trigger pulses are supplied by a pulse width modulator PBM having two input terminals. The negative input terminal is connected to a horizontal frequency sawtooth signal UH and the positive input terminal is connected to the signal from an error amplifier FV. The error amplifier FV has two input terminals which are wired in a bridge consisting of two pairs of resistors R1, R1' and R2, R2'. The two resistors R1 and R1' are connected to the operating voltage UB and a capacitor Cl. The current sensor resistor RS is located between these resistors. One of the two other branches of the bridge receive a fixed reference potential VDC from resistor R2 and the other branch receives a vertical frequency sawtooth signal UV from resistor R2' The error amplifier FV regulates the width of the pulses, and thus the deflection current, in such a way that the bridge voltage Ub is zero.

In the FIG. 1 embodiment, a transconductance amplifier, which has the ability to convert an input voltage into an output current, is used as the error amplifier FV. In the example, the transconductance amplifier supplies a current of 1 to 2 mA per 1V change in input voltage, i.e. it has a g of 1 to 2 mA/V. The output terminal of the amplifier FV is connected to an input stage including an RC network, pulse width generator PBM, and the switching circuit thyristor TH and diode D. The RC circuit is composed of a resistor Ra and a capacitor Ca and is connected to the output terminal of the transconductance amplifier. The RC circuit has a RC time constant in the order of several line times and therefore complete correction is carried out in a few lines. In this embodiment the output stage operates in a D-type operation. In a circuit design tested in practice, a resistance Ra of 33 kOhm and a capacitance Ca of 15 nF were used. A capacitor Cb is parallel to the RC circuit to filter out the remaining line frequency components. In this way, the drift of the horizontal sawtooth signal and the drift of the electronic switch are eliminated. The resistor Ra of the RC circuit supplies the P-portion of the PI controller which also guarantees stability of regulation.

Another preferred embodiment is shown in FIG. 2. In this embodiment the output stage is an amplifier which works in A-B operation. The positive input terminal of the amplifier V is connected to a fixed reference voltage Vref. The signal from the transconductance amplifier FV is connected to the negative, input of terminal of the amplifier V. The same considerations regarding drift and temperature behavior are valid for this arrangement as with the preferred embodiment shown in FIG. 1.

I claim:

1. A video display deflection apparatus, comprising:
   a deflection winding;
   a source of sawtooth signal at a frequency that is related to a deflection frequency;
   a source of a first supply voltage developed at a first terminal of said deflection winding; and
   a deflection amplifier responsive to said sawtooth signal and coupled to said deflection winding to form a DC-coupled, non-switched deflection circuit for generating at a second terminal of said deflection winding an output voltage that varies in a manner to produce a deflection current in said deflection winding such that said output voltage has a single polarity.

2. An apparatus according to claim 1, wherein said output and first supply voltages are at the same polarity.

3. An apparatus according to claim 1 further comprising, a second supply voltage that is coupled to a supply terminal of said amplifier having the same polarity as said first supply voltage.

4. An apparatus according to claim 3, wherein a magnitude of said second supply voltage is double a magnitude of said first supply voltage.

* * * * *